(12) United States Patent
Amadi et al.

(10) Patent No.: US 8,749,303 B2
(45) Date of Patent: Jun. 10, 2014

(54) OVER-CURRENT PROTECTION FOR A SWITCH MODE CLASS D AUDIO AMPLIFIER

(75) Inventors: Christophe Amadi, Edinburgh (GB); Mykhaylo Teplechuk, Edinburgh (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 1067 days.

(21) Appl. No.: 12/800,041

(22) Filed: May 6, 2010

(65) Prior Publication Data

US 2011/0267731 A1 Nov. 3, 2011

(30) Foreign Application Priority Data

Apr. 29, 2010 (EP) ..................................... 10368022

(51) Int. Cl.
 *H03F 3/68* (2006.01)
(52) U.S. Cl.
 USPC ........................... 330/10; 330/251; 330/207 A
(58) Field of Classification Search
 USPC ...................... 330/207 P, 298, 10, 251, 207 A
 See application file for complete search history.

(56) References Cited

U.S. PATENT DOCUMENTS

| | | | |
|---|---|---|---|
| 5,506,532 A | 4/1996 | Milazzo | |
| 5,917,369 A | 6/1999 | Nguyen | |
| 5,973,569 A | 10/1999 | Nguyen | |
| 6,339,360 B1 | 1/2002 | Santillano | |
| 7,315,202 B2 * | 1/2008 | Tsuji | 330/10 |
| 7,425,864 B2 * | 9/2008 | Risbo | 330/10 |
| 7,554,409 B1 | 6/2009 | Zhang et al. | |
| 7,679,380 B2 | 3/2010 | Tai | |
| 7,701,287 B2 | 4/2010 | Cheng et al. | |
| 7,705,673 B2 * | 4/2010 | Teng et al. | 330/207 P |
| 2005/0083114 A1 | 4/2005 | Risbo | |
| 2007/0040608 A1 | 2/2007 | Magrath et al. | |
| 2007/0236286 A1 | 10/2007 | Kobayashi et al. | |
| 2008/0218152 A1 | 9/2008 | Bo | |

OTHER PUBLICATIONS

"Integrated Overcurrent Protection System for Class-D Audio Power Amplifiers," by Marco Berkhout, IEEE Journal of Solid State Circuits, vol. 40, No. 11, Nov. 2005, pp. 2237-2245.
European Search Report 10368022.9-2215 Mail date—Nov. 10, 2010, Dialog Semiconductor GmbH.

* cited by examiner

*Primary Examiner* — Hieu Nguyen
(74) *Attorney, Agent, or Firm* — Saile Ackerman LLC; Stephen B. Ackerman

(57) ABSTRACT

Circuits and methods for over-current protection of pulse-width modulation systems such as switch mode class D audio systems, DC-to-DC converters, or switch mode power supplies have been disclosed. Over-current protection has been achieved by introducing supply-scalable pulses to bring the modulation index of PWM pulses to a safe level. Additionally to the over-current protection a recovery circuit and method to be applied right after an over-current situation has been disclosed.

33 Claims, 5 Drawing Sheets

OVER-CURRENT PROTECTION FOR A SWITCH MODE CLASS D AUDIO AMPLIFIER

BACKGROUND OF THE INVENTION (1) Field of the Invention

This invention relates generally to the field of audio amplifiers and relates more specifically to over-current protection of integrated class D audio amplifiers.

(2) Description of the Prior Art

Over-current protection requirement:

Most applications require to bound output signals within some defined limits. Over-current protection is required to protect an integrated switch-mode audio power amplifier against high currents that can flow through the output devices. In switched mode audio amplifiers large output devices used for high power efficiency offer a low resistance path between the power supply (battery) and ground via load. Unbound currents can damage output devices. The damages caused by high currents inside the IC are mainly due to electro-migration in metallization tracks and bond wires. The limited power dissipation due to large DC currents within MOS devices can also be an issue.

Prior art operation:

Provided the outputs of a class-D audio amplifier (H-bridge tied load) are connected via a load (Rload>4 Ohms) and the voltage supplies remain within specification even a full scale pulse-width modulated (PWM) signal, for example 95% modulation, will not result in a output current that significantly exceeds maximum specified output current (safe maximum for output devices/metal tracks/bond-wiring). The output current $I_o$ amounts to:

$$I_o = \frac{M \times Vbat}{Rload + Rsw + Rconnect},$$

wherein M is a modulation index, Vbat is a power supply voltage (e.g. a battery), R (load, sw, connect) is an impedance of load, switch device, and connect impedance.

In order to give an example of an over-current situation it has to be noted that nothing physically prevents the input's amplitude to exceed a specified range. In case the amplifier's gain is set to e.g. 6 dB, a feedback system will try to reproduce the large amplitude at the output amplified by a factor of 2. In such case, the output signal of a loop filter stage will exceed maximum or minimum values of the triangular PWM waveform causing comparators that produce the PWM signal to become saturated either one or zero for a period of time that is defined by the input signal. The PWM output stream becomes over-modulated and the outputs are consequently fixed in one state (fully ON or OFF). This produces a DC path from supply to ground via the load. Where this is the case, the current flows through the output devices according to Ohms law and a 6V supply can produce almost 1.5 A through a 4 Ohms load.

Solutions dealing with over-current detection schemes are described in following articles/patents:

Marco Berkhout describes in his article "Integrated Over-current Protection system for class-D audio power amplifiers" (IEEE JSSC Vol. 40, no. 11, November 2005) a series detection scheme and a parallel detection scheme:

1. Series detection scheme:

A small "sense" resistor is inserted between the power supply pin and the source of the output device. A comparator compares the voltage drop across the resistor against a reference to detect an over-current situation. The drawbacks of such a detection scheme are the following: The resistance inserted in the power path decreases efficiency, a high precision comparator and reference voltage are required, and process spread and temperature dependence of metal resistance cause inaccuracies.

2. Parallel detection

The current through the power transistor is measured indirectly by comparing its voltage drop across an output device (Vds) using the voltage drop of a N-times smaller replica transistor (parallel device with same Vgs) that is biased at a reference current. The drawbacks are current consumption and an additional chip-area required, which determines the scheme accuracy through device matching). Accuracy means low N factor that in return means large chip area and large reference current.

Furthermore Santillano (U.S. Pat. No. 6,339,360) discloses

3. Digital detection

When the input of comparators exceeds a reference triangle waveform, the pulse-width-modulated signal output by the comparators gets saturated (either high or low). A digital counter (or any other digital detection circuit) detects that the PWM is "locked" in either of these two states and inserts narrow pulses to lower the modulation index, thus lowering the current at the same time. Saturation implies that the modulation index is 100%.

Moreover the following patents deal with over-current protection:

U.S. Patent Application Publication (US 2009/0153251 to Cheng et al.) discloses a voltage detection type over current protection device, which applies to the output stage of a CMOS Class-D audio amplifier. Generally, a Class-D audio amplifier is used to drive a high-load loudspeaker; therefore, it needs a high-current driver. When there is a short circuit in the load, the high current will burn out the driver stage. The present invention detects the output voltage to indirectly monitor whether the output current is too large. Once an over current is detected, the output-stage transistor is turned off to stop high current lest the circuit be burned out.

U.S. Patent Application Publication (US 2009/0160428 to Tai) proposes an over current detection device, which uses a first NOT gate and a second NOT gate to reverse the logic states of a first digital signal and a second digital signal which are digitalized audio signals in a class D power amplifier. Next, a CMOS transistor receives the reversed digital signals and drives a load. A comparing circuit detects the current of the load and compares the current with the reversed first and second digital signals. When the current of the load is too high, the comparing circuit respectively outputs a first electrical signal and a second electrical signal to a first logic gate and a second logic gate. Then, the logic gate outputs a signal to activate a protection circuit to prevent the entire circuit be damaged or burned out.

U.S. Patent Application (U.S. Pat. No. 7,554,409 to Zhang et al.) proposes an over-current protection circuit and method for protecting switching power amplifier circuits providing protection against latch-up and other failures due to energy returned from an inductive load when one or more transistors in the amplifier output are disabled in response to an over-current condition. Upon detection of an over-current condition, the transistor corresponding to the over-current conduction direction is disabled. At the same time, the transistor corresponding to the conduction direction opposite the over-current direction is enabled for a predetermined time period, or until the magnitude of the load current has dropped, so that energy stored in inductance of the load is reduced, preventing back-currents that would otherwise cause latch-up and consequent destruction of the output stage when the switching power output stage is disabled. After the predetermined time period has elapsed or the load current has dropped below a threshold, the entire output stage is disabled.

U.S. Patent Application (U.S. Pat. No. 5,917,369 to Nguyen) discloses a pulse-width modulation (PWM) circuit in a Class D audio amplifier including output-limiting logic and an automatic gain control (AGC) circuit. When an out-of-range, or overmodulated, input signal is received by the PWM, mono-stable multivibrator circuits provide discharge pulses that ensure that the PWM output will not spend excessive time in a single state. By using discrete mono-stable multivibrators, uniform and repeatable pulses can be generated at precise intervals.

Furthermore U.S. Patent Application (U.S. Pat. No. 6,917, 569 to Nguyen) discloses a Class D amplifier including a tracking circuit and a regulation circuit to provide efficient, accurate protection against excessive current flow in the power FET's of the amplifier output stage. The FET currents flowing in the output stage are mirrored across tracking resistors by the tracking circuit. The resultant voltage drops are compared to reference voltages to detect over-current situations. By mirroring scaled-down versions of the output currents, power consumption in the tracking circuit is minimized. When an over-current situation is detected, the regulation circuit modulates the duty cycle of the signal input to the output stage until the FET currents fall to acceptable levels.

U.S. Patent Application Publication (US 2008/0218152 to Bo) discloses a method for sensing the supply current of a switched DC-to-DC converter. The method sensing a first voltage that is proportional to the supply current, wherein the first voltage has first noise; outputting a second voltage that is based on the first voltage, and wherein the second voltage has second noise that is smaller than the first noise; and comparing the second voltage to a reference voltage to provide an indication of the supply current. According to the systems and methods disclosed herein, accurate current sensing is provided.

SUMMARY OF THE INVENTION

A principal object of the present invention is to achieve an over-current detection scheme for any pulse width modulation system.

A further object of the present invention is to improve efficiency of an over-current detection scheme for switch mode class D audio amplifiers.

A further object of the present invention is to achieve an over-current detection scheme for switch mode class D audio amplifiers.

A further object of the present invention is to achieve an over-current detection scheme for switch mode class D audio amplifiers by introducing supply-scalable pulses to bring the modulation index to a safe level.

Moreover an object of the present invention is to achieve an over-current detection scheme for switch mode class D audio amplifiers by introducing two different pulsing schemes to limit the current.

Furthermore an object of the present invention is to achieve an addition to the over-current detection scheme for a sound's system recovery and other schemes.

In accordance with the objects of this invention a method for detecting and solving an over-current situation of a pulse-width modulated system has been achieved. The method invented comprises, firstly, the steps of: (1) providing a pulse-width modulated system comprising a filter, means to detect an over-current situation, a PWM modulator, a pulse generator, means to multiplex output from pulse generator with output from PWM modulator, (2) starting normal operation of the pulse-width modulated system, and (3) monitoring continuously data stream out of the PWM modulator in order to detect an over-current situation until the pulse modulated system is switched of. Furthermore the method invented comprises the steps of: (4) checking if an over-current situation is detected and, if so, go to step (5), otherwise repeat step (4), (5) setting an over-current signal, and (6) enabling the pulse generator. Finally the method invented comprises (7) multiplexing the output of the pulse generator with PWM modulator output, (8) bounding output current by suitable modulation caused by pulses from the pulse generator, (9) resetting over-current signal after over-current situation is solved, and (10) resuming normal operation of the pulse-width modulated system and go back to step (4).

In accordance with the objects of this invention a circuit for a digital over-current protection of a pulse-width modulation system has been achieved. The circuit invented, firstly, comprises: a filter filtering input signals of the pulse-with modulation system, a PWM modulator having inputs and an output, wherein a first input is the output of said filter, a second input are triangle pulses and the output is a PWM data stream, and a detector monitoring said data stream having clock pulses as input and when no transitions in the data stream occur within a defined time period an over-current flag is set by the detector. Furthermore the circuit comprises a pulse generator generating pulses while the over-current flag is set, a multiplexing means multiplexing pulses generated by said pulse generator with the PWM data stream from the PWM modulator, a power stage having an input and an output, wherein the input is the output of said multiplexing means and the output is connected to a load and to a feedback circuit, and said feedback circuit having an input and an output wherein the input is connected to the output of the power stage and the output of the feedback circuit is connected to the input of the pulse-width modulated system.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose methods and systems to achieve a digital over-current protection scheme for switch mode class D audio amplifiers with analog feedback. It should be noted that the present invention is also applicable for any pulse-width modulation (PWM) systems such as DC-to-DC converters, switch mode power supplies, etc.

Figure 1:
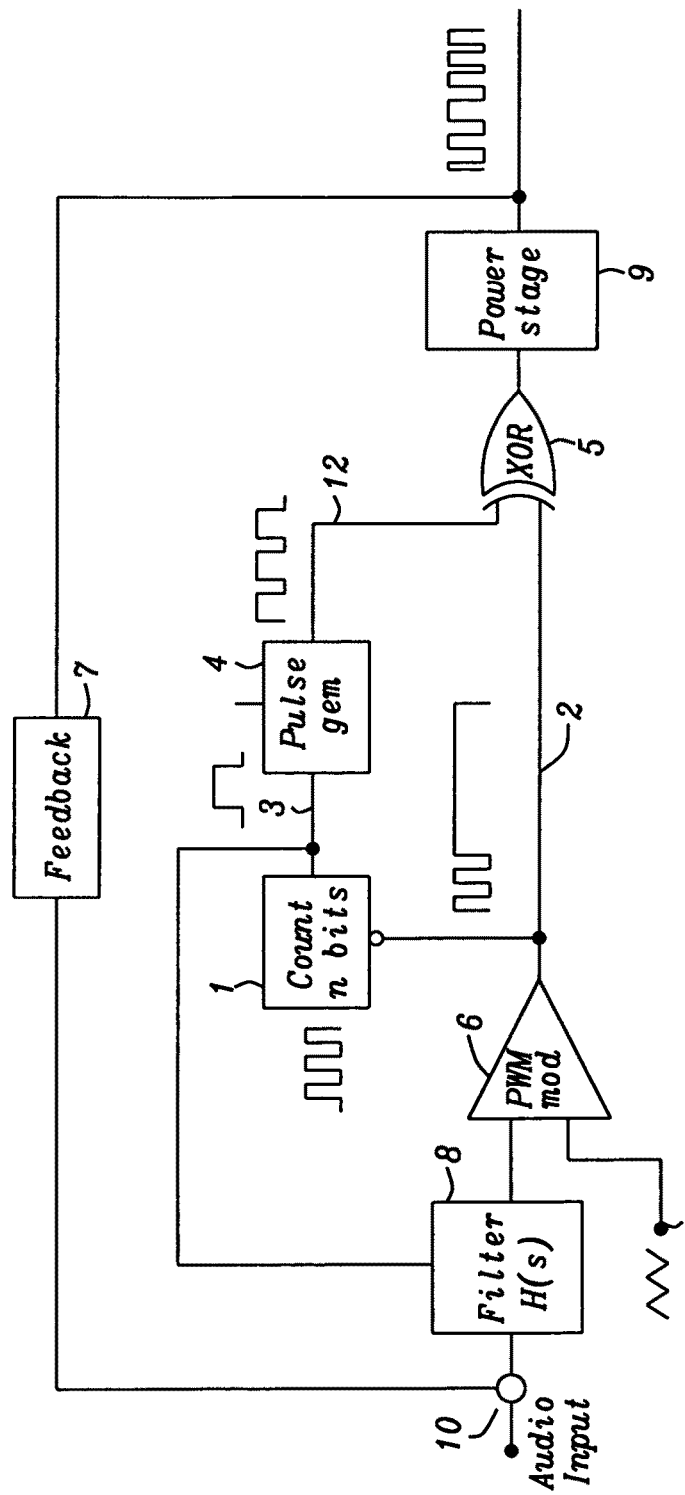
FIG. 1 illustrates a block diagram of an over-current protection invented of a pulse-width modulation system.

FIG. 1 illustrates a block diagram of a preferred embodiment of an over-current protection (OCP) scheme of the present invention applied for a switched mode class D audio amplifier. The over-current protection scheme disclosed prevents the drawbacks of prior art solutions by monitoring a PWM stream 2 from the output of a comparator stage, i.e. pulse-width modulator (PWM) 6 modulating an audio input 10 filtered by filter 8, by a triangle waveform 11. The detector 1 monitors the data stream 2 out of the PWM modulator 6 and when no transitions (either rising or falling edge) for a defined number N consecutive clock periods, e.g. two clock periods at least, an over-current flag 3 is raised. In a preferred embodiment the detector 1 is a counter counting transitions in a defined number of clock periods. An analog feedback circuit 7 is connected between the output of a power stage 9 and the input of the pulse-width modulated system. The analog feedback circuit 7 is a network composed of two resistors (or 4 for a differential configuration). One is called the input resistor and the other one is connected between the output and the input of the first amplifier stage is called the feedback resistor. The resistors of the analog feedback circuit 7 are shown in more details in FIG. 5. The aim is to provide a fraction of the output signal back to the input in order to have a servo-reaction (controlled loop).

When an over-current situation has been detected, a pulse-generator 4 is enabled and its output is multiplexed into the output stream, in a preferred embodiment by a logical exclusive disjunction, also called exclusive or XOR stage 5. The train of pulses 12 introduced has a supply-scalable duty cycle, which limits artificially the output current of the power stage 9, i.e. the current through the load. In a preferred embodiment the pulse width of the pulses generated by the pulse generator scales with the supply to keep a modulation index in the order of about 95% and achieve thus a safe maximum output current. In other words the pulse width is proportional to the supply voltage. The higher the supply voltage, the wider the pulse is.

The obvious advantage of the present invention is that there is no audio-"hole" due to the disabling of one of the loop blocks but rather hard clipping by the introduction of a positive feedback to keep the current flowing through the outputs within controlled limits. If the artificial pulses provide an equivalent N % modulation then the output current $I_o$ will be bounded by $$I_o = \frac{\frac{N}{100} \times Vbat}{Rload + Rsw + Rconnect},$$

wherein N is said defined number of consecutive clock periods used to define an over-current situation, Vbat is a power supply voltage (e.g. a battery), R (load, sw, connect) is an impedance of load, switch device, and connect impedance.

Furthermore the present invention discloses an addition for a sound system's recovery. When the over-current flag 3 is raised the feedback loop is partially broken since input conditions do not directly affect output conditions. When the PWM stream 2 returns, because the input's amplitude is back to normal, the result can be a small transient spike in the output signal. Such a spike can result in unpleasant audible artifacts and also can lead to reduced recovery time.

In order to aid recovery from an over-current state and prevent ringing and overshoots the filter block 8 is switched from a high order to a lower order mode until specified time passes after the PWM modulator 6 returns to its normal operation. In the preferred embodiment of the invention this specified time amounts to as non-limiting example 16p seconds. After this specified time the filter 8 switches back to its original higher order. In the preferred embodiment of the invention filter block 8 is switched from a from a second order mode to a first order mode and back after the specified time interval. Switching from an order mode higher than two to a lower and back would also be possible.

Figure 5:
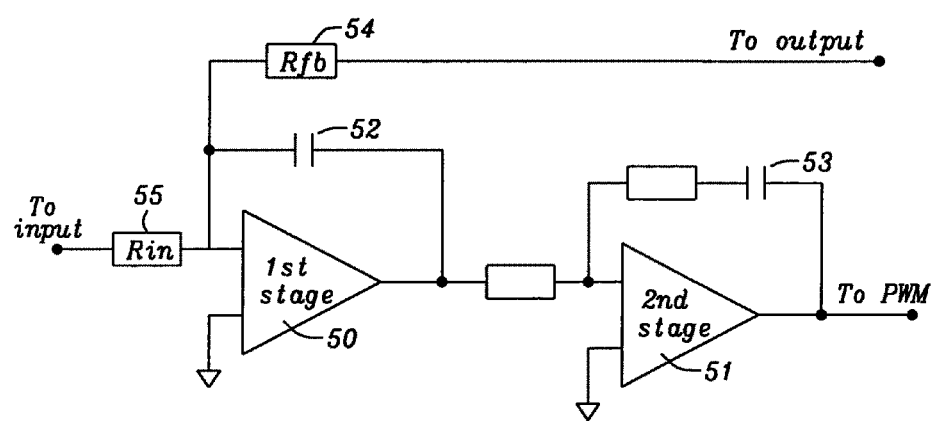
FIG. 5 illustrates a block diagram of the filter shown in FIG. 1.

FIG. 5 illustrates a block diagram of the filter 8 shown in FIG. 1. It shows a first integrator stage 50 comprising an integrating capacitor 52 and a second integrator stage 51 comprising an integrating capacitor 53. Furthermore FIG. 5 shows the feedback resistor network of the analog feedback circuit 7 comprising input resistor Rin 55 and feedback resistors Rfb 54.

One way to implement the switching from a high order mode to a lower order mode is to bypass the integrating capacitor 52 within only the first integrator stage 50 of the loop filter 8. This particular way to react on the over-current situation enhances audio performance during over-current state by eliminating possible overshoots and/or /settling artifacts in the output signal that are inherent to high order systems.

Other recovery schemes could consist of different ways to decrease the gain of the principal analog feedback loop, comprising input resistor Rin 55 and feedback resistors Rfb 54 in case of an over-current situation by, for example, inserting a current source at the virtual grounds of the integrator.

One way to reduce the gain of the system is to act on the feedback resistor values. The gain is set by the ratio: Closed loop gain=Rfb/Rin. By decreasing the resistance of the feedback resistor Rfb 54 or increasing the resistance of resistor Rin 55, the gain is lowered.

Alternatively, charges can be dumped onto the integrating capacitor 52 in order to lower the gain of the overall loop or adjusting, i.e. reducing gain by employing automatic gain control (AGC) scheme. Other methods to reduce the gain of the system are possible as well.

Figure 2:
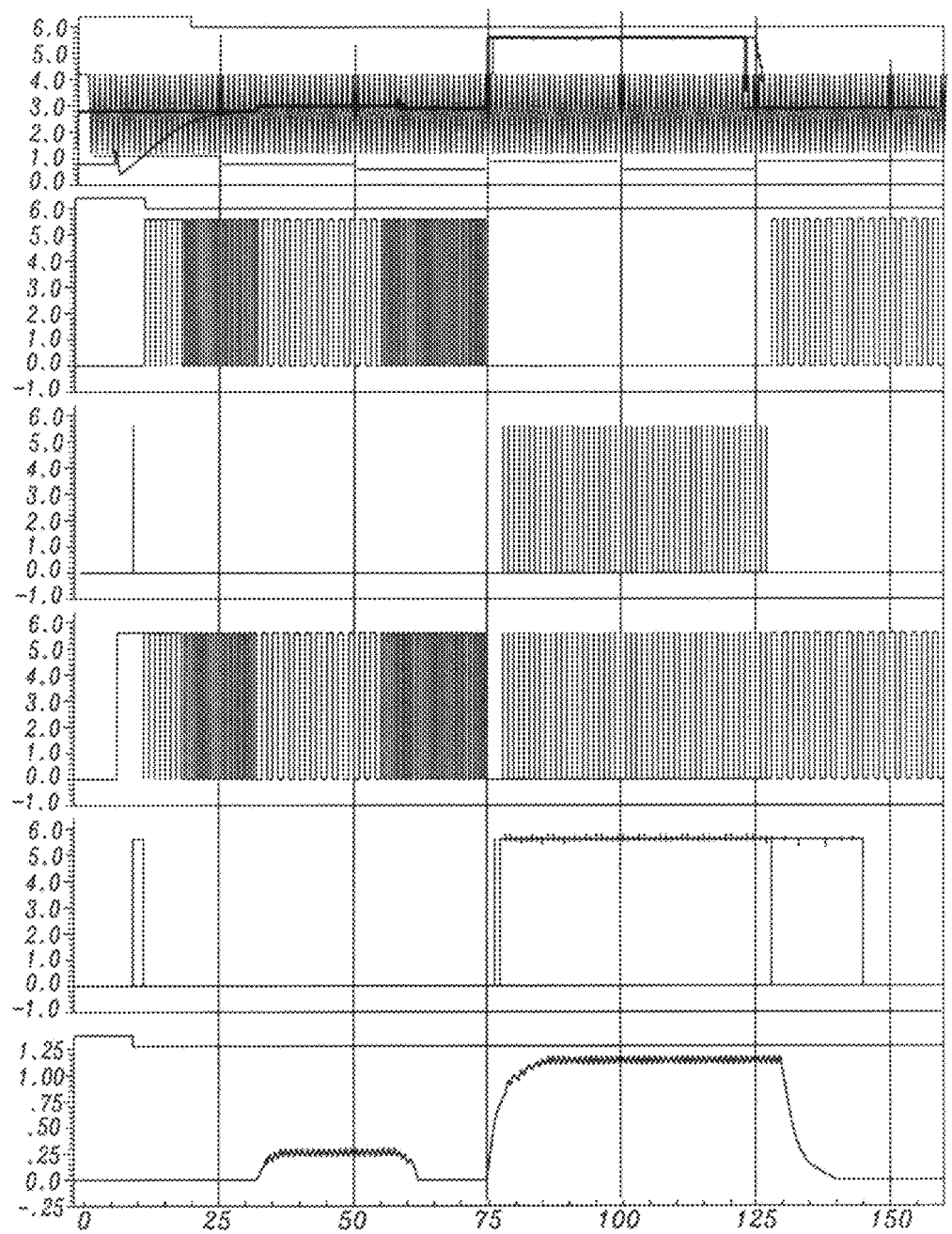
FIG. 2 illustrates as example simulation results of functional operation of a preferred embodiment of the OCP scheme invented.

FIG. 2 illustrates as example simulation results of functional operation of a preferred embodiment of the OCP scheme invented.

The following traces are illustrated in FIG. 2:
Trace 21: Amplifier input signal
Trace 22: Loop filter's output
Trace 23: Triangle/ramp waveform
Trace 24: PWM modulator output
Trace 25: Pulse generator output
Trace 26: PWM output after minimum pulses insertion
Trace 27: over-current limit flag
Trace 28: First order recovery control signal
Trace 29: Current through the output devices At point of time 0 the amplifier is started up and after approximately 20 μseconds it can be seen that all signals are defined and settled.

At point of time 30 μseconds a step signal has been applied to the input of the amplifier (trace 21), it can be seen that the output of the PWM modulator (trace 24) is defined and a pulse train is present. Such step signal did not cause the system to saturate and the system behaves normally. It can also be seen that such step signal caused an output current (trace 29) to flow via load (approx. 250 mA).

At point of time 60 μseconds the input signal (trace 21) has been reduced to zero and the system returned to its quiescent state.

At point of time 75 μseconds a pulse of the input signal has been applied. It can be seen that that such signal caused the system to saturate. Trace 21 shows that the input to the PWM block is unbound and PWM output does not contain any pulses (trace 24). In this situation pulse generator 4 starts to generate pulses (trace 25) and the output of the amplifier 5 (trace 26) shows a bound pulse train with minimum pulse insertion. Traces 27 and 28 demonstrate the over-current flag and first order recovery control respectively. Trace 29 shows that the output current is well defined (approx. 1.1 A).

Figure 3:
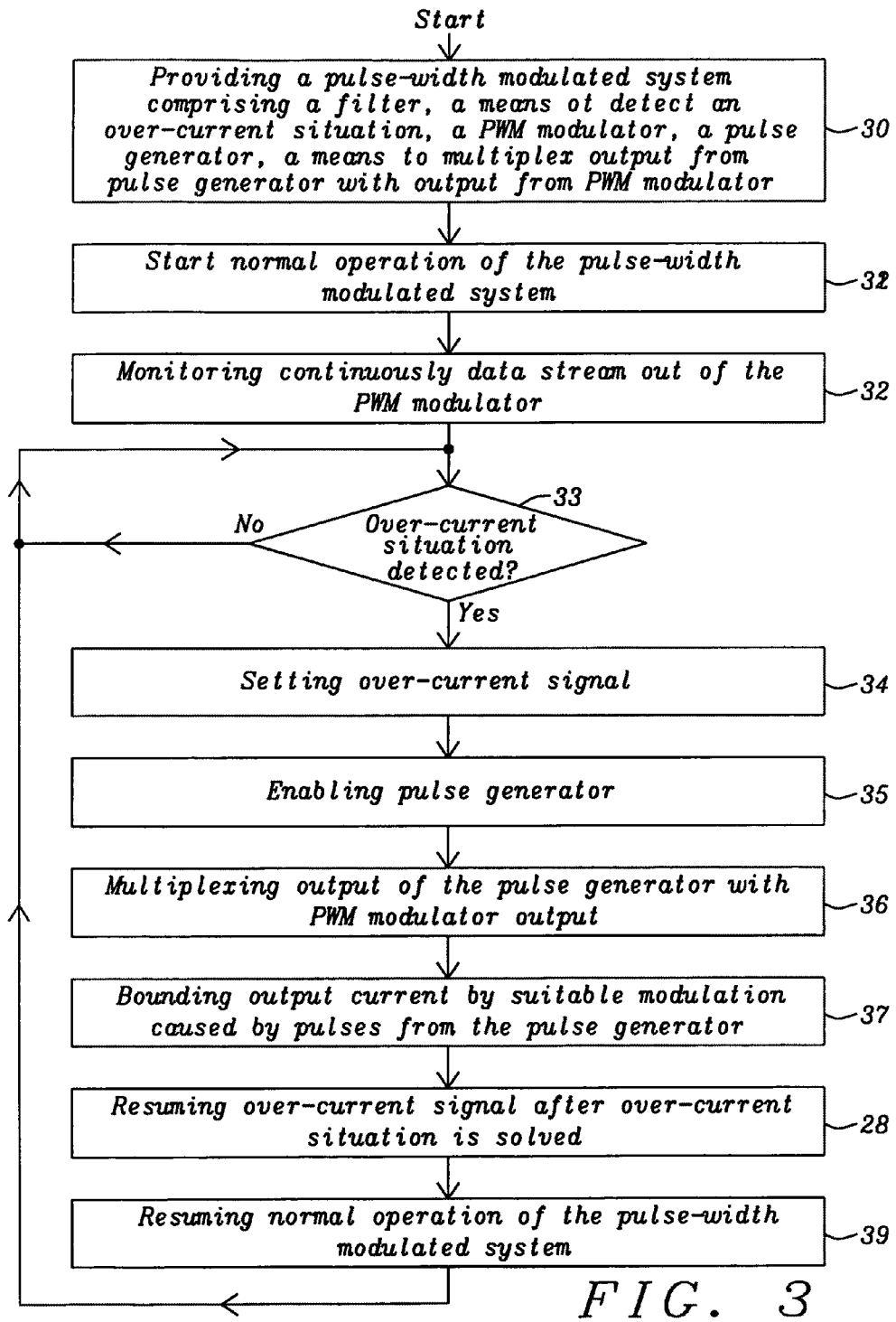
FIG. 3 illustrates a flowchart of a method invented to detect and solve an over-current situation of a pulse-width modulated system such as switch-mode class-D amplifiers, DC-to-DC converters, switch-mode power supplies, etc.

FIG. 3 illustrates a flowchart of a method invented to detect and solve an over-current situation of a pulse-width modulated system such as switch-mode class-D amplifiers, DC-to-DC converters, switch-mode power supplies, etc. A first step 30 describes the provision of a pulse-width modulated system comprising a filter, means to detect an over-current situation, a PWM modulator, a pulse generator, means to multiplex output from pulse generator with output from PWM modulator. The following step 31 illustrates starting normal operation of the pulse-width modulated system. The next step 32 depicts monitoring continuously data stream out of the PWM modulator until the PWM system is switched off. Step 33 is a check if an over-current situation is detected and, if so, the process flow goes to step 34, otherwise the check of step 33 is repeated. Step 34 describes setting an over-current signal followed by enabling the pulse generator in step 35. Step 36 illustrates multiplexing the output of the pulse generator with PWM modulator output and step 37 describes bounding output current by suitable modulation caused by pulses from the pulse generator. Step 38 illustrates resetting over-current signal after over-current situation is solved and step 39 describes resuming normal operation of the pulse-width modulated system and the process flow goes back to step 33 if the pulse-width modulated system has not been switched off.

Figure 4:
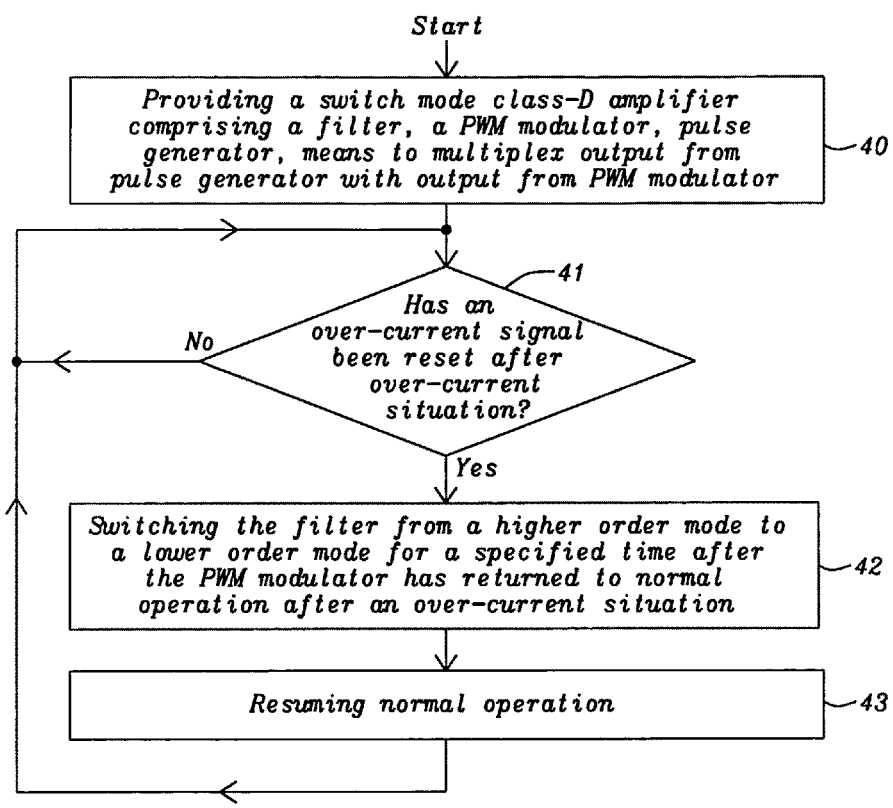
FIG. 4 illustrates a flowchart of a supplementary method to aid recovery from an over-current situation of a switched mode class D audio amplifier.

FIG. 4 illustrates a flowchart of a method supplementary to the method invented described above aiding recovery from an over-current situation of a switched mode class D audio amplifier. A first step 40 describes the provision of a switch mode class-D audio amplifier comprising a filter, a PWM modulator, pulse generator, means to multiplex output from pulse generator with output from PWM modulator. Step 41 is a check if an over-current signal has been just reset after an over-current situation, if so the process flow goes to step 42, else the check of step 41 is repeated. Step 42 illustrates switching the filter from a higher order mode to a lower order mode for a specified time after the PWM modulator has returned to normal operation after an over-current situation and the following step 42 depicts resuming normal operation and the process flow goes back to the check of step 41. The method ends when the audio amplifier is switched off.

It should be noted that the method described in FIG. 4 can be applied also to any pulse-width modulation systems such as DC-to-DC converters, switched mode power supplies, etc.

In summary, the following improvements are obtained by the present invention:
  The Power efficiency has been improved. No additional components (usually resistors) are required in the power path.
  Silicon area is saved. No sensing circuitry is required (no comparator or sensing devices to match to power devices requiring low multiplicity factor).
  Accuracy is increased. The scheme invented doesn't rely on high precision analog circuitry.
  Independence of process variations and easy portability to a different technology node due to a fully digital detection scheme.
  Preventing possible damage to a load by limiting output power to a load rated limit.
  Improving recovery time from over-current condition.

While the invention has been particularly shown and described with reference to the preferred embodiments thereof, it will be understood by those skilled in the art that various changes in form and details may be made without departing from the spirit and scope of the invention.

What is claimed is:

1. A method for detecting and solving an over-current situation of a pulse-width modulated system comprising the steps of:
   (1) providing a pulse-width modulated system comprising a filter, means to detect an over-current situation, a PWM modulator, a pulse generator, means to multiplex output from pulse generator with output from PWM modulator;
   (2) starting normal operation of the pulse-width modulated system;
   (3) monitoring continuously data stream out of the PWM modulator in order to detect an over-current situation until the pulse modulated system is switched off;
   (4) checking if an over-current situation is detected and, if so, go to step (5), otherwise repeat step (4);
   (5) setting an over-current signal;
   (6) enabling the pulse generator generating pulses having a supply-scalable duty cycle;
   (7) multiplexing the output of the pulse generator with PWM modulator output;
   (8) bounding output current by suitable modulation caused by pulses from the pulse generator;
   (9) resetting over-current signal after over-current situation is solved; and
   (10) resuming normal operation of the pulse-width modulated system and go back to step (4).

2. The method of claim 1 wherein said pulse-width modulated system is a switch mode class D audio amplifier.

3. The method of claim 1 wherein said pulse-width modulated system is a DC-to-DC converter.

4. The method of claim 1 wherein said pulse-width modulated system is a switch mode power supply.

5. The method of claim 1 wherein said means to detect an over-current situation by monitoring said data stream is performed by a counting device counting transitions occurring in a time period defined.

6. The method of claim 5 wherein an over-current situation is defined when no transitions are counted by said counting device during N clock periods.

7. The method of claim 6 wherein an over-current situation is defined when no transitions are counted by said counting device during at least two clock periods.

8. The method of claim 1 wherein said pulse generator generates pulses having a supply-scalable duty cycle with about 95% modulation index of the pulses generated.

9. The method of claim 8 wherein said supply-scalable duty cycle is achieved by setting the pulse width of the pulse-width modulated system proportional to the supply voltage.

10. The method of claim 1 wherein said means to multiplex is a logical XOR-gate.

11. The method of claim 1 wherein a method to recover the pulse-width modulated system after an over-current situation comprising the steps of:
    (11) checking if an over-current signal has been just reset after an over-current situation and, if so, go to step (12), else repeat the check of step (11);
    (12) switching the filter from a higher order mode to a lower order mode for a specified time after the PWM modulator has returned to normal operation after an over-current situation; and
    (13) go to step (10).

12. The method of claim 11 wherein said specified time has duration in the order of magnitude of 16 µseconds.

13. The method of claim 11 wherein said switching the filter from a high order to a lower order is performed by bypassing an integrating capacitor within a first integrator stage of the filter.

14. The method of claim 1 wherein a method to recover the pulse-width modulated system after an over-current situation comprises reducing a gain of a principal analog feedback loop.

15. The method of claim 14 wherein said gain is reduced by inserting a current source at virtual ground of an integrator of the filter.

16. The method of claim 14 wherein said gain is reduced by dumping charges onto an integrating capacitor of the filter.

17. The method of claim 14 wherein said gain is reduced by employing automatic gain control.

18. A circuit for a digital over-current protection of a pulse-width modulation system comprising:
   a filter capable of filtering input signals of the pulse-with modulation system;
   a PWM modulator having inputs and an output, wherein a first input is the output of said filter, wherein said PWM modulator is capable of receiving triangular pulses at a second input, and wherein said PWM modulator capable of generating a PWM data stream at the output;
   a detector capable of monitoring said data stream, wherein said detector is capable of receiving clock pulses as input and, when no transitions in the data stream occur within a defined time period, is capable of setting an over-current flag;
   a pulse generator, while the over-current flag is set, is capable of generating pulses having a supply-scalable duty cycle;
   a multiplexing means capable of multiplexing pulses generated by said pulse generator with the PWM data stream from the PWM modulator;
   a power stage having an input and an output, wherein the input is the output of said multiplexing means and the output is connected to a load and to a feedback circuit; and
   said feedback circuit having an input and an output wherein the input is connected to the output of the power stage and the output of the feedback circuit is connected to the input of the pulse-width modulated system.

19. The circuit of claim 18 wherein said pulse-width modulated system is a switch mode class D audio amplifier.

20. The circuit of claim 18 wherein said pulse-width modulated system is a switch mode power supply.

21. The circuit of claim 18 wherein said detector is a counter counting transitions of said PWM data stream.

22. The circuit of claim 18 wherein said supply scalable duty cycle is proportional to the supply voltage.

23. The circuit of claim 18 wherein said pulses generated have a modulation index ensuring a safe maximum output current of the power stage.

24. The circuit of claim 23 wherein said pulses generated have a modulation index of about 95%.

25. The circuit of claim 18 wherein said multiplexing means is a logical exclusive disjunction XOR stage.

26. The circuit of claim 18 wherein an additional circuit to recover the pulse-width modulated system after an over-current situation comprises a connection between said detector and said filter.

27. The circuit of claim 26 wherein right after the over-current flag is reset a high order of the filter is reduced to a lower order for a defined time span.

28. The circuit of claim 27 wherein said time span is in the order of magnitude of 16 µseconds.

29. The circuit of claim 26 wherein the pulse-width modulated system is recovered after an over-current situation by reducing a gain of a principal analog feedback loop.

30. The circuit of claim 29 wherein said gain is reduced by inserting a current source at virtual ground of an integrator of the filter.

31. The circuit of claim 29 wherein said gain is reduced by dumping charges onto an integrating capacitor of the filter.

32. The circuit of claim 29 wherein said gain is reduced by employing automatic gain control.

33. The circuit of claim 18 wherein said feedback circuit comprises an input resistor and two or more feedback resistors.

* * * * *